United States Patent [19]

Henry

[11] Patent Number: 5,098,735
[45] Date of Patent: Mar. 24, 1992

[54] SHIELDING OF HOUSES AND BUILDINGS FROM LOW AND HIGH FREQUENCY EMF RADIATION BY ORGANIC BASED STABILIZED NICKEL CONDUCTIVE COATINGS

[75] Inventor: Richard G. Henry, Mayfield Heights, Ohio

[73] Assignee: Advanced Research Technologies, Park Ridge, Ill.

[21] Appl. No.: 583,954

[22] Filed: Sep. 14, 1990

[51] Int. Cl.⁵ .............................................. B05D 3/02
[52] U.S. Cl. ................................. 427/8; 174/35 MS; 252/513; 427/385.5; 523/137; 524/439
[58] Field of Search .................. 174/35 MS; 252/513; 427/8, 385.5; 523/137; 524/439

[56] References Cited

U.S. PATENT DOCUMENTS 4,493,912  1/1985  Dudgeon et al. .................. 524/562
4,825,090  4/1989  Grabis .............................. 250/505.1

Primary Examiner—Michael Lusignan
Attorney, Agent, or Firm—Robert J. Black

[57] ABSTRACT

A new process is provided which when used will shield occupants of any dwelling from EMF radiation. The conditions specify the use of a conductive material which resists the passage of electric charge in a very narrow range, from 0.2–400 ohms/square with 377 ohms/square as best. This number has a special significance: it is the resistance of a perfect absorber of electromagnetic radiation. The coating will be used as a primer paint and will provide an excellent shield from EMF radiation, especially that which occurs with high voltage lines at 60 Hz but also for microwave radiation at a frequency of 10 kilohertz to 100 gigahertz.

7 Claims, No Drawings

SHIELDING OF HOUSES AND BUILDINGS FROM LOW AND HIGH FREQUENCY EMF RADIATION BY ORGANIC BASED STABILIZED NICKEL CONDUCTIVE COATINGS

BACKGROUND OF THE INVENTION

Like every other conductive surface the coating develops surface charge in response to an electric field, and specifically just the right distribution and concentration of charge to terminate the perpendicular electric field lines and prevent them from penetrating to the home's interior. This shielding accords with Gauss' law, which states that electric field lines can only start and end on electric charges. The coating also develops a surface current in response to a parallel magnetic field, in keeping with Ampere's law, which relates magnetic fields to electric currents. In the coating the surface current has just the right value to shield the interior from the parallel magnetic field.

General Relativity's description of the EMF at the surface of the coating is beautifully and simply expressed in terms of surface charges and currents. One aspect of the description is fulfilled by regarding the coating as obeying the law of conservation of charge. Whenever electric charge is encountered it changes into surface charge which moves from place to place on the coating. Charge is neither created nor destroyed from this point of view. The sum of the real charge accumulated on the coating remains constant.

A second aspect of the description takes the form of an equally simple stipulation of Ohm's law, which relates currents to the electric fields that drive them. Nearly every conductor offers some resistance to the flow of current; for a thin sheet of conductor the resistance is quantified as surface resistivity. The mathematics of General Relativity, translated into the conductive coating, specify a precise value for the surface resistivity of the coating. It is 377 ohms/square, which is to say that an electric field of 377 volts would be needed to drive one ampere of current across a square patch of coating material. It has a special significance, it is the surface resistivity of a perfect absorber of electromagnetic radiation.

This invention is especially significant because government studies have shown that electromagnetic radiation can cause significant health effects such as leukemia, cancer, and disorientation. The application of this coating, because of its unique physical and electrical properties will provide protection from the normally penetrating and potentially dangerous electromagnetic fields.

SUMMARY OF THE INVENTION

Electromagnetic fields which arise from electrical power lines are experienced in the 60 Hertz range. To insure safety in the home it has become necessary to see that home occupants are shield from this type of varying magnetic field. All surfaces which can be painted will require this coating for best results. The conductive paint will be painted onto the exterior of the house, allowed to dry and a latex or other suitable exterior house paint will be painted over it so as to give the house its proper appearance. Obviously, windows cannot be painted but there should be enough overall EMF absorption that this will not be a problem.

This coating will be an organic-based system which will use nickel in the form of small suspended particles with a precise resistivity—preferably 377 ohms/square.

Nickel is a versatile material with a wide range of industrial applications where it is used either as a pure metal or an alloying element. These uses generally depend upon one of the basic properties of the metal such as its high corrosion resistance, its excellent mechanical performance or its inherent magnetism. Nickel, alone amongst the non-precious metal pigments, possesses a unique combination of the required properties together with a coat that is acceptable for this application. This is why it has become one of the preferred materials in this new technology.

Nickel fortunately forms an oxide film which allows electrical continuity between contacting particles while also passivating the metal surface. This provides good corrosion resistance, another vital property for a pigment which is to be used in this application.

Pure nickel may be used as a pigment as well as coated nickel particulates and nickel coated particulates which may be less costly for use in this process.

DESCRIPTION OF THE PREFERRED EMBODIMENT

The nature of this invention involves the use of a Nickel flake powder (Novamet Type HCA-1) suspended in an organic medium (Rohm & Haas acrylic resin) which will allow for a narrow resistivity range.

TABLE 1

|  | Parts by Weight |
| --- | --- |
| Rohm & Haas Acryloid B-66 | 10.0 |
| Kenrich KR-1385 Organic Titanate | 5.4 |
| Toluol | 30.0 |
| Nickel Flake HCA-1 | 60.0 |
| Denatured Ethyl Alcohol (Jaysol) | 10.0 |

TABLE 2

|  | Parts by Weight |
| --- | --- |
| Rohm & Haas Acryloid A-11 | 5.0 |
| Kenrich KR62ES Organic Titanate | 8.0 |
| Toluol | 30.0 |
| Nickel Flake HCA-1 | 60.0 |
| Bentonite Clay, Bentone 34 | 1.5 |

To formulate, first predisperse resin and titanate in solvents, load into mill, add nickel flake and mix for 15 minutes until a completely homogenous mixture is obtained.

Proper measurement of the resistivity of the dried coating will be necessary to obtain the proper EMF absorbing characteristics of the surface. Accurate surface resistivity measurements can be performed by using a flat probe of a specific area which will be used on the positive probe and the negative probe of the ohmmeter. An exact area is not necessary as long as both the positive probe and the negative probe are of the same area. Set the ohmmeter to the proper scale and press the probes onto the coating surface to obtain an accurate reading of the surface resistivity.

Reformulate using less nickel or more resin to obtain the proper resistivity of the surface. The correct resistivity is 377 ohms/square. When this resistivity is reached a perfect absorber of electromagnetic radiation will then be obtained. Even if this precise resistivity is not reached, the coating will still have extremely powerful EMF blocking characteristics because of nickel's innate ferromagnetism.

What is claimed is:

1. A method of making an organic based electromagnetic wave attenuating composition comprising the steps of:
   a) dispersing acrylic resin and organic titanate into non aqueous organic solvents;
   b) loading the above materials into a mill;
   c) adding nickel flake;
   d) mixing the total combination until a homogenous mixture is obtained.

2. The method of claim 1 wherein:
   a portion of the homogenous mixture is applied to a test surface.

3. The method of claim 2 wherein:
   said mixture applied to said test surface and is allowed to dry.

4. The method of claim 3 wherein:
   after said mixture is applied to said surface and allowed to dry, said test surface is measured for surface resistivity.

5. The method of claim 4 wherein:
   if said test surface resistivity as measured is greater than 377 ohms/square, more nickel is added to the mixture to increase the resistivity of the mixture to as close to 377 ohms/square as possible.

6. The method of claim 3 wherein:
   if said test surface resistivity as measured is less than 377 ohms/square, more resin is added to the mixture to increase the resistivity of the mixture to as close to 377 ohms/square as possible.

7. The method of claim 4 wherein:
   said measurement is taken by utilizing an ohmmeter equipped with positive and negative probes of the same area, pressed into the surface of the dried mixture applied to the test surface.

* * * * *